United States Patent [19]

Quinn

[11] Patent Number: 5,514,997
[45] Date of Patent: May 7, 1996

[54] INVERTING DELAY CIRCUIT

[75] Inventor: Patrick J. Quinn, Eindhoven, Netherlands

[73] Assignee: U.S. Philips Corporation, New York, N.Y.

[21] Appl. No.: 216,987

[22] Filed: Mar. 23, 1994

[30] Foreign Application Priority Data

Apr. 14, 1993 [EP] European Pat. Off. ............. 93201100

[51] Int. Cl.$^6$ ..................................................... H03K 5/00
[52] U.S. Cl. ........................ 327/554; 327/337; 327/345; 327/266
[58] Field of Search ..................................... 327/256, 336, 327/337, 345, 339, 341, 551, 554, 263, 266, 274, 280, 287; 333/173, 9

[56] References Cited

U.S. PATENT DOCUMENTS

| | | | |
|---|---|---|---|
| 4,393,351 | 7/1983 | Gregorian et al. | 327/337 |
| 4,443,757 | 4/1984 | Bui | 333/173 |
| 4,446,438 | 5/1984 | Chang et al. | 333/173 |
| 4,453,130 | 6/1984 | Bennett | 327/337 |
| 4,644,304 | 2/1987 | Temes | 333/173 |
| 4,763,088 | 8/1988 | Negahban-Hagh . | |
| 4,857,778 | 8/1989 | Hague | 333/173 |
| 4,894,620 | 1/1990 | Nagaraj | 327/337 |
| 5,168,179 | 12/1992 | Negahban-Hagh | 327/554 |
| 5,168,461 | 12/1992 | Wu et al. | 364/828 |
| 5,331,222 | 7/1994 | Lin et al. | 327/357 |

FOREIGN PATENT DOCUMENTS 404250711  9/1992  Japan ........................... 327/554

OTHER PUBLICATIONS

Increasing the Clock Frequency of Switched-Capacitor Filters by T. R. Viswanatham, Electronics Letters 24th Apr. 1980.
Electronics Letters, 11th May 1989, vol. 25, No. 10, pp. 623-625.

Primary Examiner—Timothy P. Callahan
Assistant Examiner—T. Lam
Attorney, Agent, or Firm—Edward W. Goodman

[57] ABSTRACT

An inverting delay circuit including a differential amplifier (OTA) having a non-inverting input (+) coupled to ground, an inverting input (−) and an output; an input capacitor (Cin) which is coupled between an input of the inverting delay circuit and the inverting input (−) during a first switching phase ($\phi$), and which is discharged during a second switching phase ($\bar\phi$); a feedback capacitor (Cx) which is coupled between the output and the inverting input (−) of the differential amplifier (OTA) during the first switching phase ($\phi$), and between the inverting input (−) and ground during the second switching phase ($\bar\phi$); and an output capacitor (Co) which is coupled between the output and the inverting input (−) during the second switching phase ($\bar\phi$), the output capacitor (Co) being discharged during the first switching phase ($\phi$), a charge on the feedback capacitor (Cx) being transferred to the output capacitor (Co) during the second switching phase ($\bar\phi$).

8 Claims, 10 Drawing Sheets

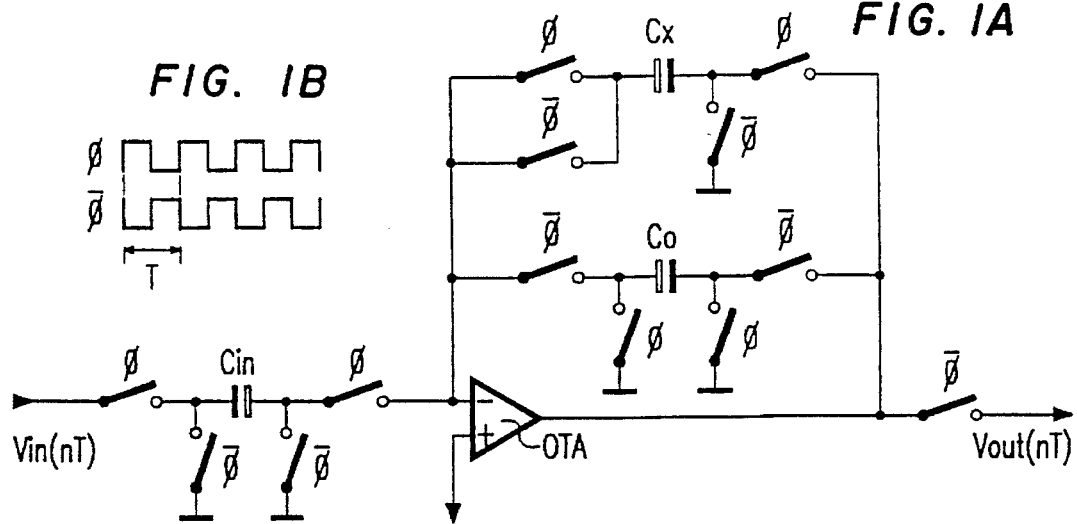
FIG. 1B
FIG. 1A
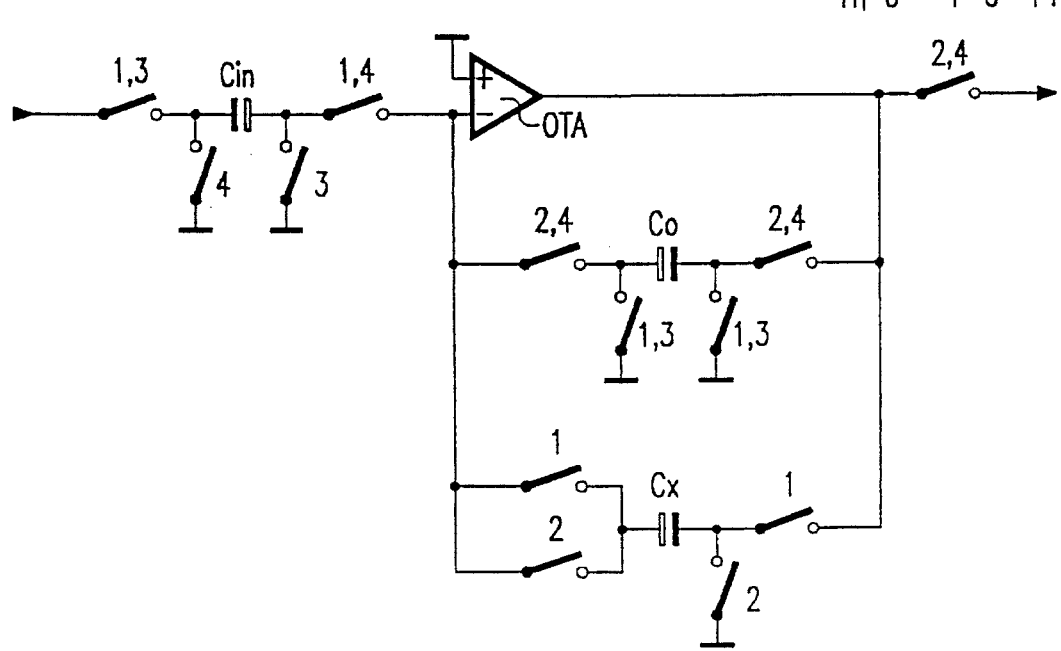
FIG. 7A
FIG. 7B
| t | 1 | 2 | 3 | 4 |
|---|---|---|---|---|
| H | 0 | −1 | 0 | +1 |

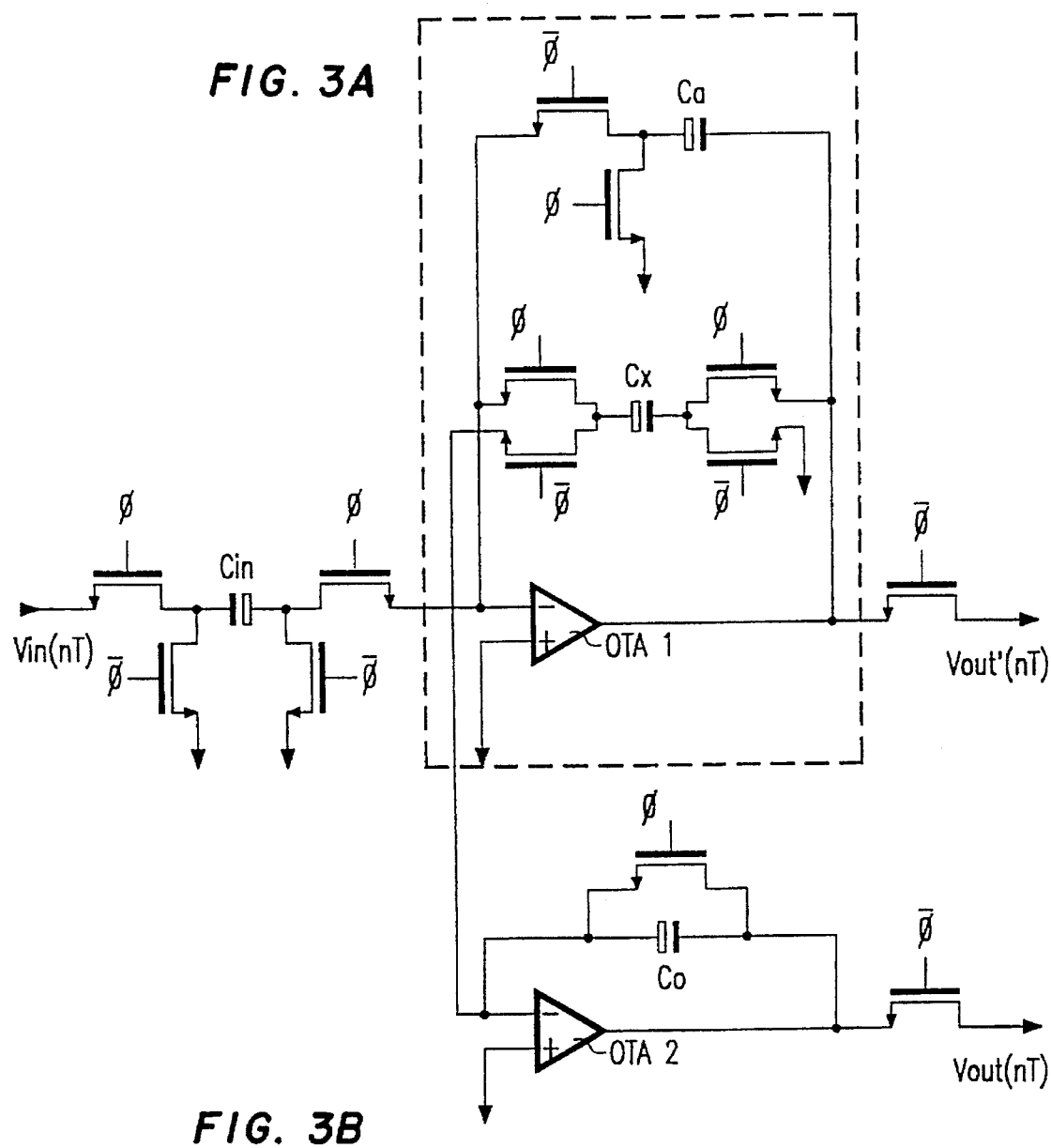
FIG. 3A
FIG. 3B
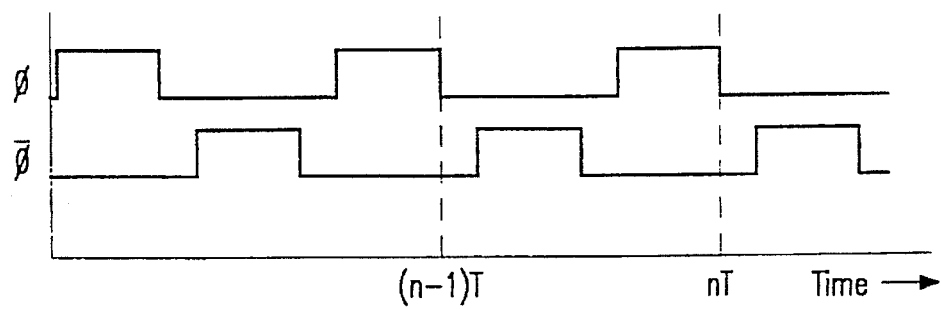

$h(n) = -2, 3, 0, -3, 2$ 5,514,997

INVERTING DELAY CIRCUIT

BACKGROUND OF THE INVENTION

1. Field of the Invention

The invention relates to an inverting delay circuit, i.e., a delay circuit whose output signal is the product of a negative factor and its input signal.

2. Description of the Related Art

The use of switched capacitor techniques has acquired increased importance in recent times. A large number of video applications are presently being investigated, which include multi-standard video comb filters and multi-standard color decoders. Complex sampled data systems (continuous amplitude, discrete time) can be produced in the latest standard digital CMOS process with, often, a considerable saving in chip area with respect to comparable digital systems.

With the realization of complex FIR or IIR filters, accurate matching of coefficients is required. Up till now, a problem in switched capacitor filters has been the accurate generation of positive and negative filter coefficients, since positive and negative filter coefficients require inherently different switched capacitor building blocks for their generation. For instance, in an anti-symmetrical FIR filter, as given by the following transfer function $$H(z)=C_M \cdot z^0 + C_{M-1} \cdot z^{-1} + \ldots -C_{M-1} \cdot z^{-(N-1)} - C_M \cdot z^{-N},$$

the coefficient $C_i$ at one sample instant has to match the coefficient $-C_i$ at another instant. A similar problem arises in switched capacitor multipliers where exact matching of positive and negative coefficients is required, for example, when successive multiplication factors $0, +1, 0, -1$ are used. Present techniques for realizing an inverting delay either cause distortion (gain errors and clock feed-through) or require an extra buffer or amplifier for realization.

Electronics Letters, 11th May 1989, Vol. 25, No. 10, pp. 623–625 shows several switched capacitor delay circuits, none of them multiplying by a negative coefficient.

SUMMARY OF THE INVENTION

It is, inter alia, an object of the invention to provide an inverting delay circuit multiplying with a negative coefficient which is accurately determinable. For this purpose, one aspect of the invention provides an inverting delay circuit comprising differential amplifying means having non-inverting input means coupled to ground, inverting input means and output means; input capacitor means which are coupled between an input of said inverting delay circuit and said inverting input means during a first switching phase, said input capacitor means being discharged during another switching phase; feedback capacitor means which are coupled between said output means and said inverting input means during said first switching phase, said feedback capacitor means being coupled between said inverting input means and ground during a second switching phase; and output capacitor means which are coupled between said output means and said inverting input means during said second switching phase, said output capacitor means being discharged during said first switching phase, a charge on said feedback capacitor means being transferred to said output capacitor means during said second switching phase.

These and other aspects of the invention will be apparent from and elucidated with reference to the embodiments described hereinafter.

BRIEF DESCRIPTION OF THE DRAWINGS

In the drawings:

FIG. 1A shows a first embodiment of an inverting delay circuit in accordance with the present invention, and FIG. 1B shows clock phase signals for controlling the switches in the circuit of FIG. 1A;

FIG. 3A shows a second embodiment of the inverting delay circuit in accordance with the present invention, provided with a stabilization loop, and FIG. 3B shows clock phase signals for controlling the switches in the circuit of FIG. 3A;

FIG. 7A shows a first embodiment of the application of the inverting delay circuit in accordance with the present invention in a demodulator, and FIG. 7B shows a table of the transfer coefficients of the circuit during a cycle of the clock phases;

DESCRIPTION OF THE PREFERRED EMBODIMENTS

FIG. 1A shows a first embodiment of an inverting delay circuit in accordance with the present invention. A sampled video input signal Vin(nT) is applied to the inverting input (−) of an operational transconductance amplifier OTA through an input capacitor Cin surrounded by switches which are closed during a first switching phase φ and opened during a second switching phase $\bar{\phi}$. The switching phase φ, and its inverse $\bar{\phi}$ as shown in FIG. 1B are periodic signals having a period equal to the sampling period T. During the second switching phase $\bar{\phi}$, the input capacitor Cin is discharged by means of switches each having one terminal connected to ground and the other terminal connected to respective ends of the input capacitor Cin. The non-inverted input (+) of the amplifier OTA is connected to ground. A feedback capacitor Cx is connected between the non-inverting input (−) and the output of the amplifier OTA during the first switching phase φ, and between the non-inverting input (−) of the amplifier OTA and ground during the second switching phase $\bar{\phi}$. An output capacitor Co is connected between the non-inverting input (–) and the output of the amplifier OTA during the second switching phase $\bar{\phi}$, and is discharged during the first switching stage $\phi$. The output video signal Vout(nT) can be taken from the output of the amplifier OTA during the second switching phase $\bar{\phi}$.

The circuit operates as follows: when the clock phase $\phi$ is high, the capacitor Cx is charged up to the negative input voltage, the magnitude being given by the ratio of Cin to Cx. The value of Cx is preferably chosen to be greater than that of Cin, so as not to overdrive the output of OTA. On the following clock phase, when $\bar{\phi}$ is high, the charge on Cx is completely transferred to Co. It is immediately clear that the capacitor Cx plays no part in the transfer function of the circuit, which is given by:

Vout(nT)=–Cin/Co.Vin((n–½)T), or

Vout(z)=–Cin/Co.$z^{-1/2}$.Vin(z).

The delay circuit thus provides a half sampling period delay.

Figure 2A:
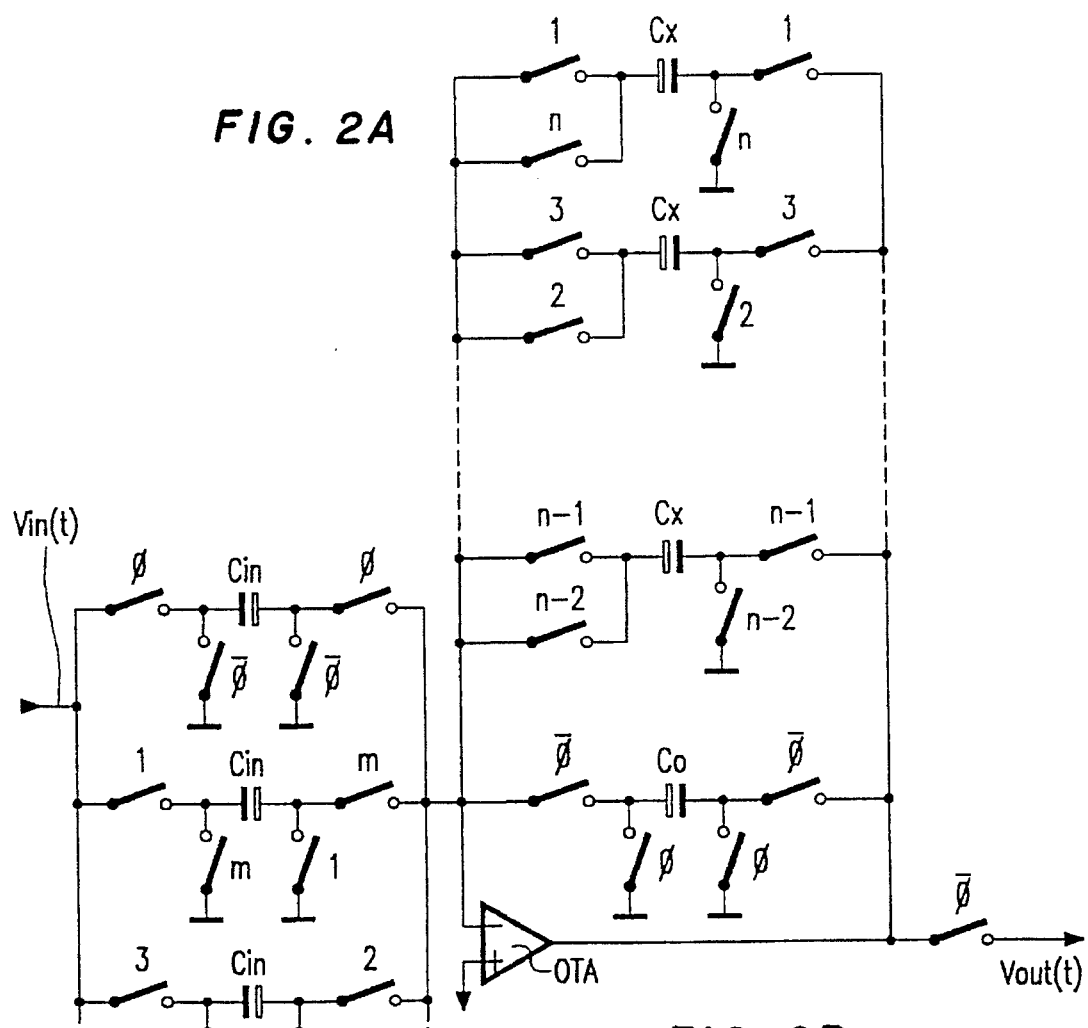
FIG. 2A shows the application of the circuit of FIG. 1A in a single amplifier N-path filter structure.
Figure 2B:
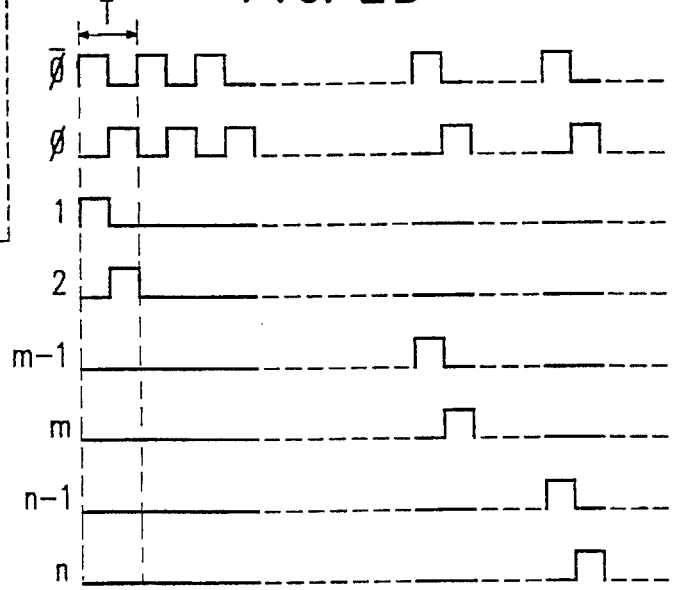
FIG. 2B shows clock phase signals for controlling the switches in the circuit of FIG. 2A.

FIG. 2A shows the application of the circuit of FIG. 1A in a single amplifier N-path filter structure. FIG. 2B shows, in addition to the clock phases $\phi$ and its inverse $\bar{\phi}$, several derived clock phases 1, 2, . . . , m–1, m, . . . , n–1, n, which are each high for one half sampling period during n successive half sampling periods T/2 and which are each shifted in phase by one half sampling period T/2 with respect to the preceding derived clock phase. In parallel to the input capacitor Cin with its surrounding switches as in FIG. 1A, additional sections are provided which each have an input capacitor Cin and surrounding switches controlled such that the respective input capacitor Cin is charged during first derived clock phases 1, 3, . . . , m–1, while its charge is transferred towards the fed-back amplifier OTA during second respective derived clock phases m, 2, . . . , m–2. The feedback capacitor Cx with its surrounding switches as illustrated in FIG. 1A, is replaced by (n–1)/2 parallel sections which each have a feedback capacitor Cin and surrounding switches as in FIG. 1A but now controlled such that the respective feedback capacitor Cx is connected between the inverting input (–) and the output of the amplifier OTA during first derived clock phases 1, 3, . . . , n–1, while its charge is transferred towards the output capacitor Co during second respective derived clock phases n, 2, . . . , n–2. The (m+1)/2 parallel input sections provide a delay of $+z^{-(m-1)/2}$, while the (n+1)/2 parallel feedback sections provide a delay of $-z^{-(n-1)/2}$. Positive and negative delays are matched. The transfer function is given by:

Vout(z)=+Cin/Co.[$+z^{-(m-1)/2}-z^{-9(n-1)/2}$].Vin(z).

In general, $H(z)=C_i.z^{-1}+C_{i-1}.z^{-2}+C_{i-2}.z^{-3}+ \ldots -C_{i-2}.z^{-(N-2)}-C_{i-1}.z^{-(N-1)}-C_i.z^{-N}$, wherein corresponding coefficients have to be matched.

FIG. 3A shows a second embodiment of the inverting delay circuit in accordance with the present invention, provided with two amplifiers OTA1 and OTA2 and a stabilization loop across OTA1. FIG. 3B shows the clock phases $\phi$ and $\bar{\phi}$. The various switches are represented by field effect transistors. The circuit of FIG. 3A operates as follows: when the clock phase $\phi$ is high, the capacitor Cx is charged up to the negative input voltage, the magnitude being given by the ratio of Cin to Cx. The value of Cx is preferably chosen to be greater than that of Cin, so as not to overdrive the output of OTA. On the following clock phase, when $\bar{\phi}$ is high, the charge on Cx is completely transferred to the capacitor Co which is connected between the inverting input and the output of the second amplifier OTA2. Again, the capacitor Cx plays no part in the transfer function of the circuit. The extra feedback loop, formed with a capacitor Ca across the first amplifier OTA1, is to prevent OTA1 from drifting into saturation during the $\bar{\phi}$ phase. Of course, the inverted delayed output can be directly obtained from OTA1 on the $\bar{\phi}$ phase, since Ca has been charged to the negative input voltage of half a sampling period earlier, when $\phi$ was high.

Each of the $\phi$ and $\bar{\phi}$ switches connecting Ca to ground and virtual ground (formed by the inverting input of OTA2), respectively, produce DC offset but the DC offsets from both switches can be made to cancel each other exactly, producing no net DC offset on Ca. The transfer function of the inverting delay circuit shown in FIG. 3A is insensitive to the parasitic top and bottom plate capacitors of Cx and Ca.

Figures 4A, 4B:
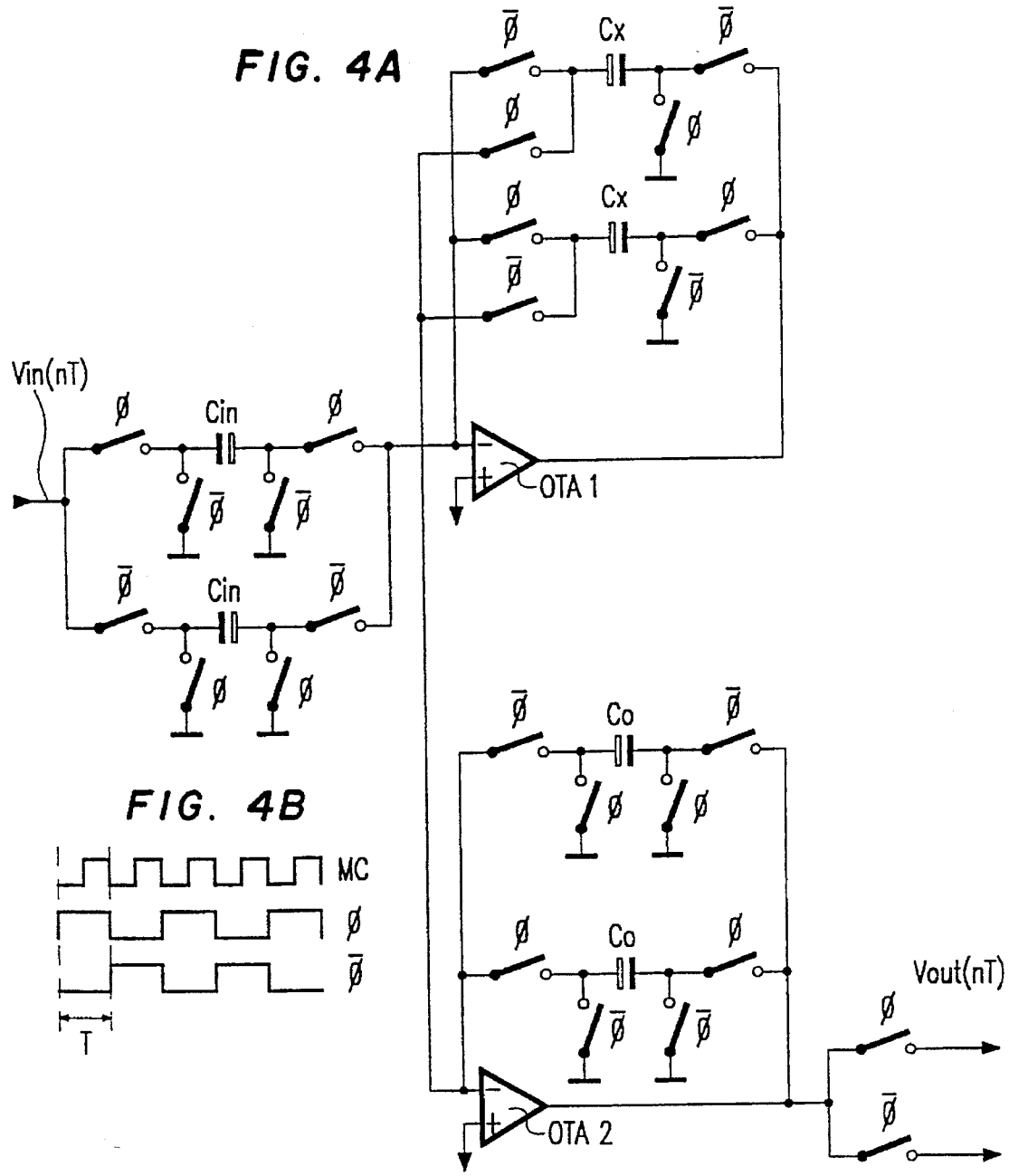
FIG. 4A shows a first embodiment of a double sampling version of the inverting delay circuit in accordance with the present invention.
FIG. 4B shows clock phase signals for controlling the switches in the circuit of FIG. 4A.

FIG. 4A shows a first embodiment of a double sampling version of the inverting delay circuit in accordance with the present invention. In parallel to the input branch formed by the capacitor Cin with its surrounding switches as in FIG. 3A, a second input branch is provided with a capacitor Cin and surrounding switches which are controlled in anti-phase to the corresponding switches of the first branch. In parallel to the feedback branch formed by the capacitor Cx with its surrounding switches as in FIG. 3A, a second feedback branch is provided with a capacitor Cx and surrounding switches which are controlled in anti-phase to the corresponding switches of the first branch. In parallel to the output capacitor branch formed by the capacitor Co with its surrounding switches as in FIG. 3A, a second output branch is provided with a capacitor Co and surrounding switches which are controlled in anti-phase to the corresponding switches of the first branch. A stabilization loop having the capacitor Ca is no longer required in the circuit of FIG. 4A as during each clock phase, one of the feedback branches prevents OTA1 from drifting into saturation. FIG. 4A shows how the clock phases $\phi$ and $\bar{\phi}$ relate to a master clock MC. This double sampling version of the inverting delay circuit provides a delay of a full sampling period T. The transfer function is given by:

Vout(nT)=–Cin/Co.Vin((n–1)T), or

Vout(z)=–Cin/Co.$z^{-1}$.Vin(z)

It should be noted here that for the same application (same sample frequency) as the single-sampling inverting delay circuit of FIG. 1A, each amplifier has double the time to reach its end value. This means that each amplifier can be less than half the size of the single amplifier required for the single sampling application, since the bandwidth of the amplifiers can be halved.

Figure 5A:
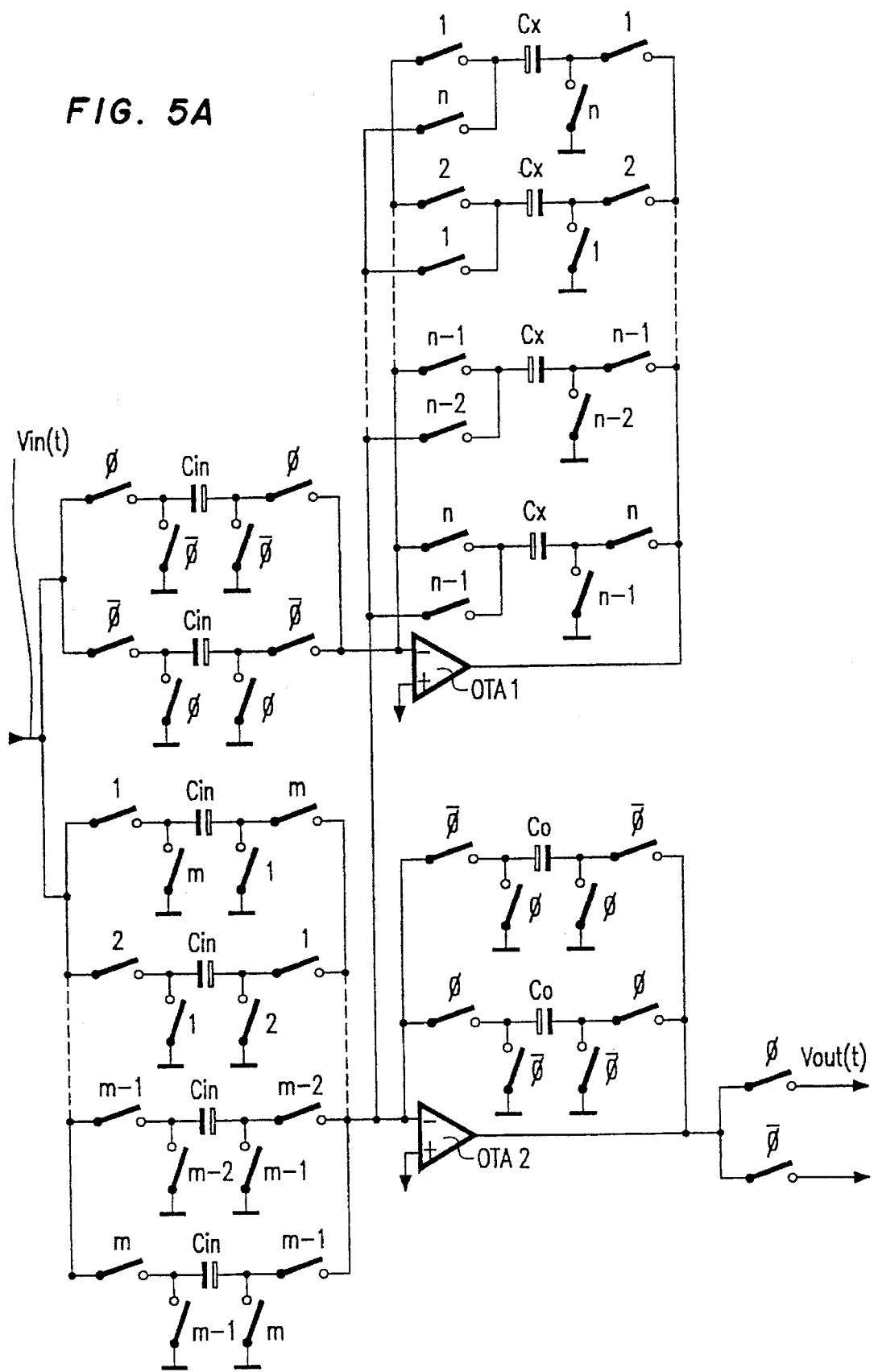
FIG. 5A shows the application of the circuit of FIG. 4 in an N-path filter structure.
Figure 5B:
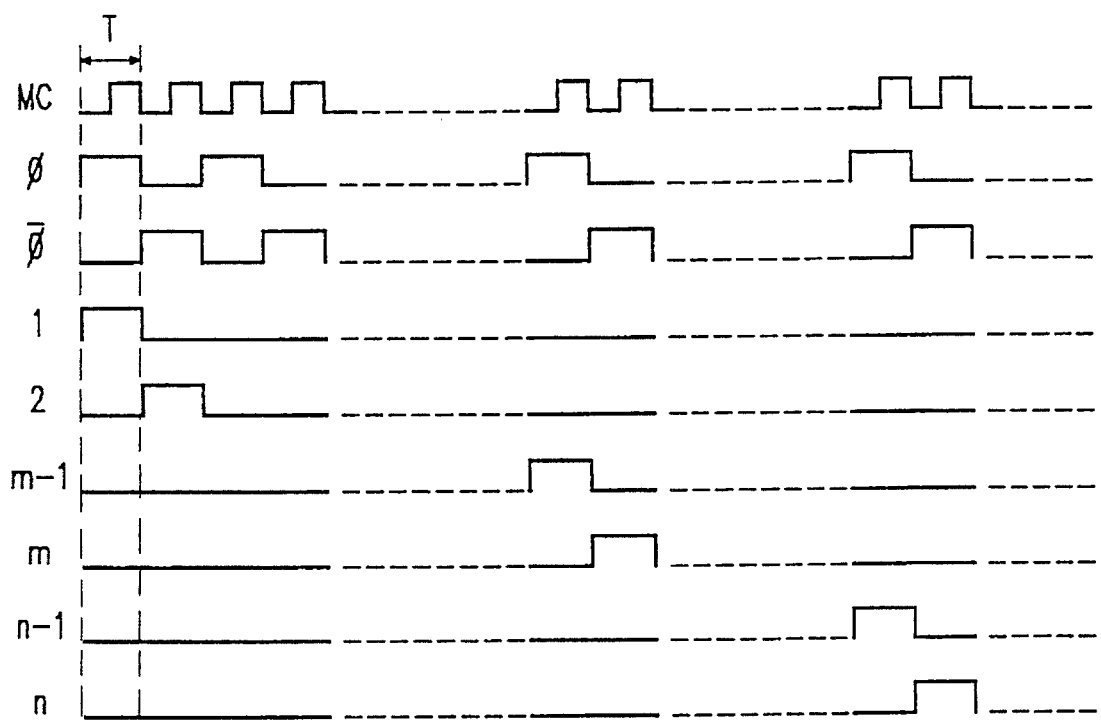
FIG. 5B shows clock phase signals for controlling the switches in the circuit of FIG. 5A.

FIG. 5A shows the application of the circuit of FIG. 4A in an N-path filter structure. FIG. 5B shows primary clock phases $\phi$, $\bar{\phi}$ and derived clock phases 1, 2, . . . , m–1, m, . . . , n–1, n having a doubled duration in comparison to those in FIG. 2A. In addition to the two input branches between the input of the circuit and the inverting input of the first amplifier OTA1 as shown in FIG. 4A, as shown in FIG. 5A, m further input branches are provided having input capacitors Cin which are charged during first derived clock phases 1, ..., m and whose charge is transferred towards the second amplifier OTA2 during second respective derived clock phases m, 1, ..., m−1. These further input branches provide a delay of $+z^{-(m-1)}$. Further, the two feedback branches across the first amplifier OTA1 as shown in FIG. 4A, are replaced by n feedback branches having feedback capacitors Cx which are coupled between the inverting input and the output of the first amplifier OTA1 during first derived clock phases 1 ... n, and which are coupled between ground and the inverting input of the second amplifier OTA2 during second respective derived clock phases n, 1, ..., n−1. These feedback branches provide a delay of $-z^{-(n-1)}$. The transfer function is given by:

$$H(z) = +Cin/Co \cdot z^{-(m-1)} - Cin/Co \cdot z^{-(n-1)},$$

which is independent of the value of Cx. Again, in general, for an N-path (FIR) filter based on the structure of FIG. 5A, the transfer function is given by:

$$H(z) = C_i \cdot z^{-1} + C_{i-1} \cdot z^{-2} + C_{i-2} \cdot z^{-3} + \ldots - C_{i-2} \cdot z^{-(N-2)} - C_{i-1} \cdot z^{-(N-1)} - C_i \cdot z^{-N},$$

wherein corresponding coefficients have to be matched.

Figure 6A:
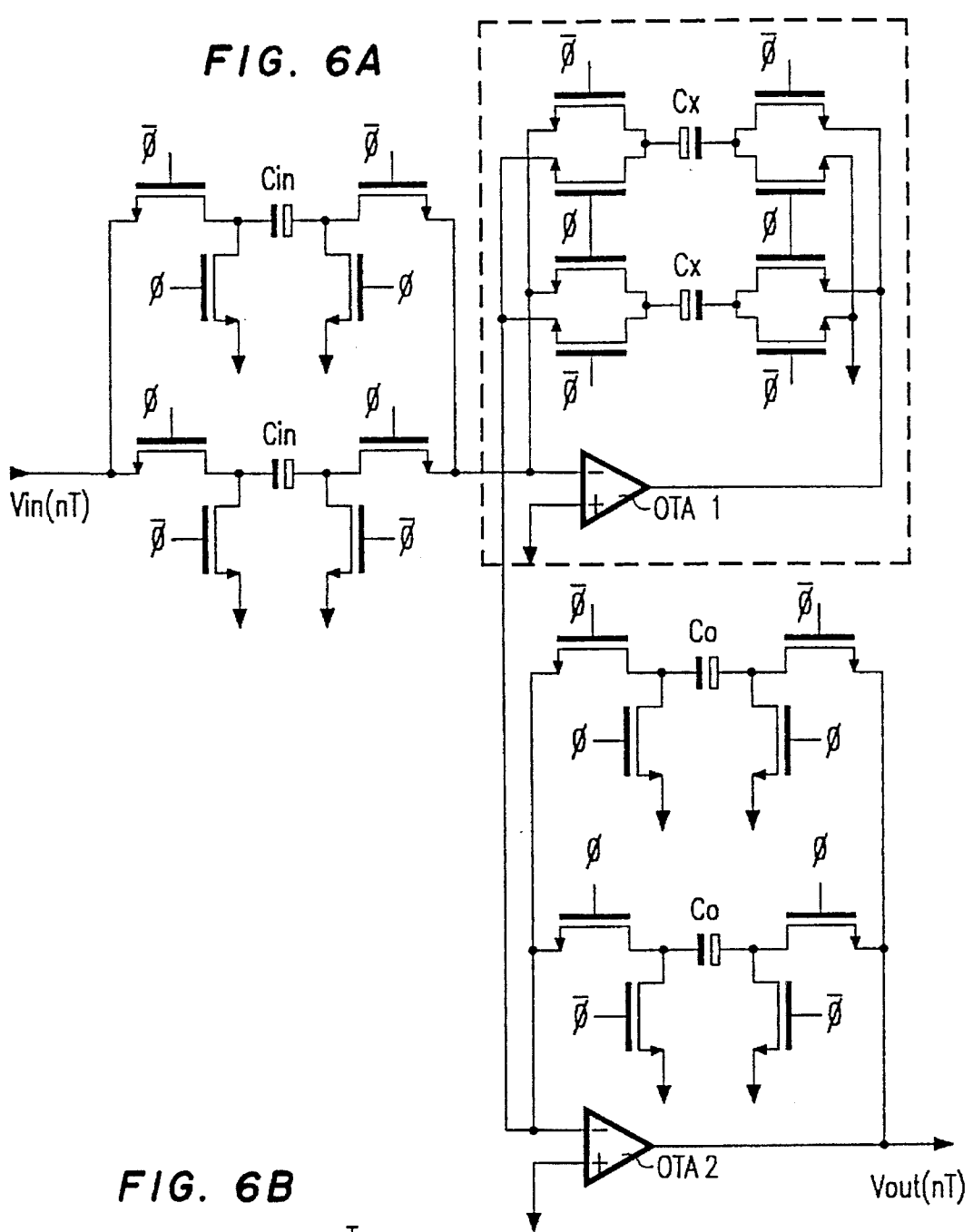
FIG. 6A shows a second embodiment of the double sampling version of the inverting delay circuit in accordance with the present invention.
Figure 6B:
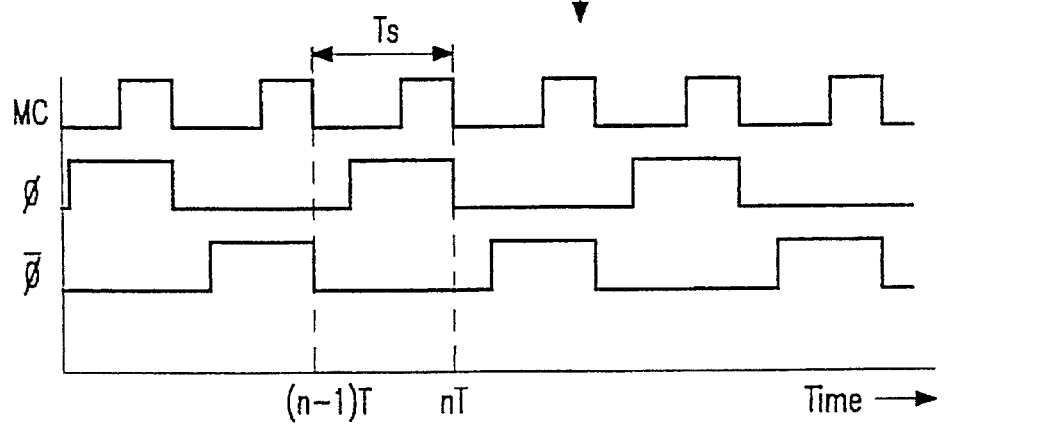
FIG. 6B shows clock phase signals for controlling the switches in the circuit of FIG. 6A.

FIG. 6A and 6B show a second embodiment of the double sampling version of the inverting delay circuit in accordance with the present invention. This circuit is similar to the circuit of FIG. 4A; the switches are implemented by means of field effect transistors. The transfer function is given by $H(z) = -Cin/Co \cdot z^{-1}$, which means that a full sampling period delay is provided again.

FIG. 7A shows a first embodiment of the application of the inverting delay circuit in accordance with the present invention in a demodulator. FIG. 7B shows a table of the transfer coefficients during a cycle of the clock phases. The input capacitor Cin is connected between the circuit input and the inverting input of the amplifier OTA during a first clock phase 1. During the same clock phase 1, the feedback capacitor Cx is charged, and the output capacitor Co is discharged. The circuit output is disconnected. During the second clock phase 2, the input capacitor Cin is disconnected, and the charge on the feedback capacitor Cx is completely transferred to the output capacitor Co. In an alternative implementation, the input capacitor Cin is discharged during the second clock phase 2. The circuit output is connected to the amplifier output and the inverting delay circuit provides a transfer coefficient −1 (the input capacitor Cin and the output capacitor Co are assumed to be identical). During the third clock phase 3, the input capacitor Cin is charged, the output capacitor Co is discharged, and feedback capacitor Cx and the circuit output are disconnected. During the fourth and last clock phase 4 of the cycle, the charge on the input capacitor Cin is transferred through the amplifier OTA which is then fed-back by means of the output capacitor Co; the inverting delay circuit provides a transfer coefficient +1. The feedback capacitor Cx is still disconnected.

Figure 8A:
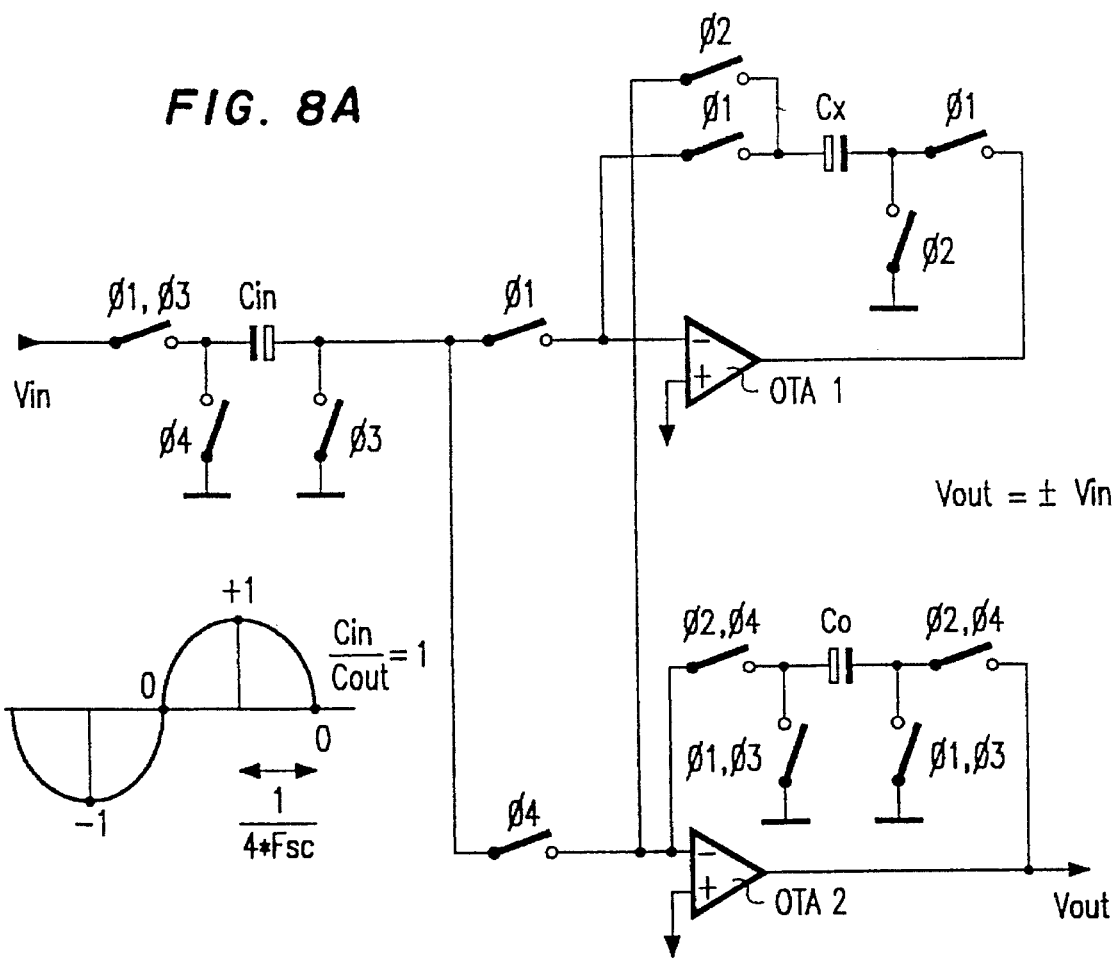
FIG. 8A shows a second embodiment of the application of the inverting delay circuit in accordance with the present invention in a demodulator.
Figure 8B:
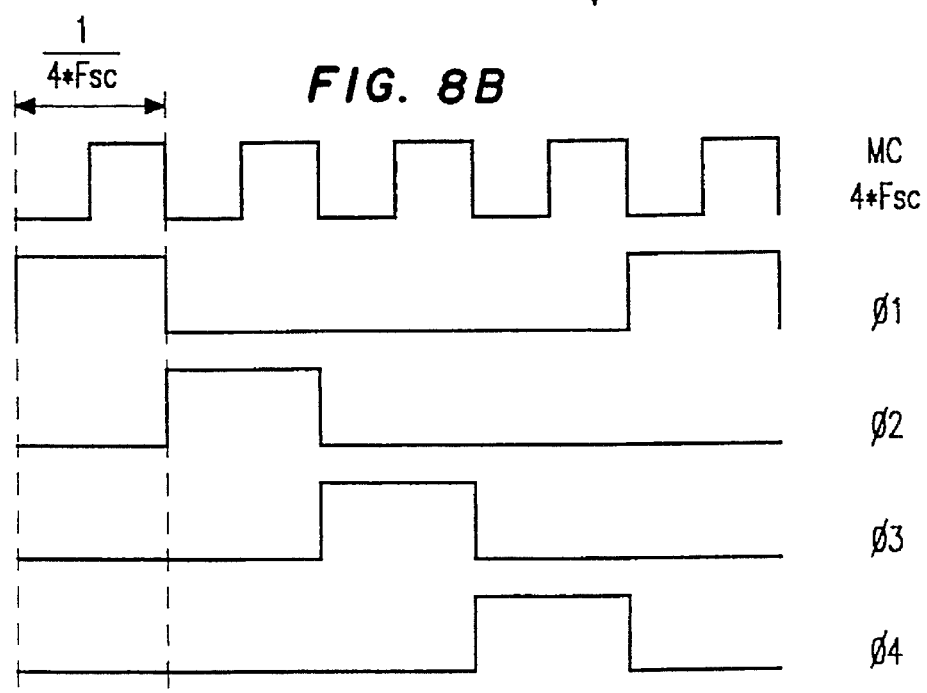
FIG. 8B shows clock phase signals for controlling the switches in the circuit of FIG. 8A.

FIG. 8A shows a second embodiment of the application of the inverting delay circuit in accordance with the present invention in a demodulator. The circuit differs from that of the preceding figure in that two amplifiers OTA1 and OTA2 are provided. The inverting input of the first amplifier OTA1 is connected to the input capacitor Cin during the first clock phase $\phi1$, while that of the second amplifier OTA2 is connected to the input capacitor Cin during the fourth clock phase $\phi4$. The feedback capacitor Cx is coupled across the amplifier OTA1 in basically the same manner as in FIG. 7A, with the exception that during the second clock phase, the feedback capacitor Cx is connected between ground and the inverting input of the second amplifier OTA2. The output capacitor Co is coupled across the amplifier OTA2 in basically the same manner as in FIG. 7A. FIG. 8B further shows how the four clock phases $\phi1$, $\phi2$, $\phi3$ and $\phi4$ relate to a master clock MC of four times the chrominance subcarrier frequency Fsc, which makes the circuit suitable as part of a chrominance demodulator.

Figure 9A:
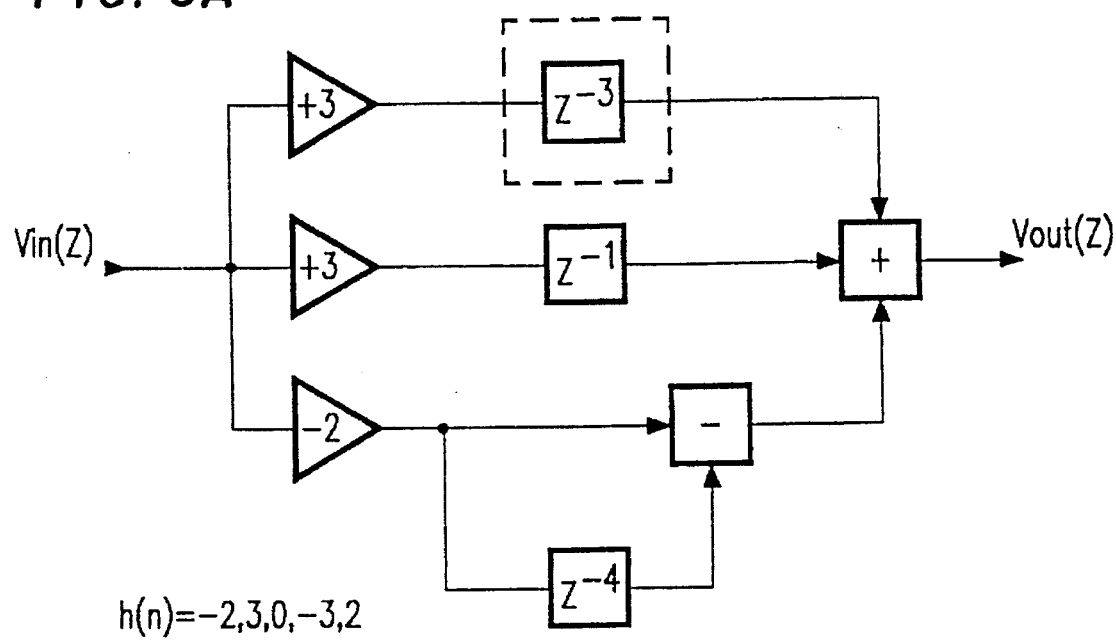
FIGS. 9A and 9C show a realization of a comb video bandpass filter using the inverting delay circuit in accordance with the present invention.
Figure 9B:
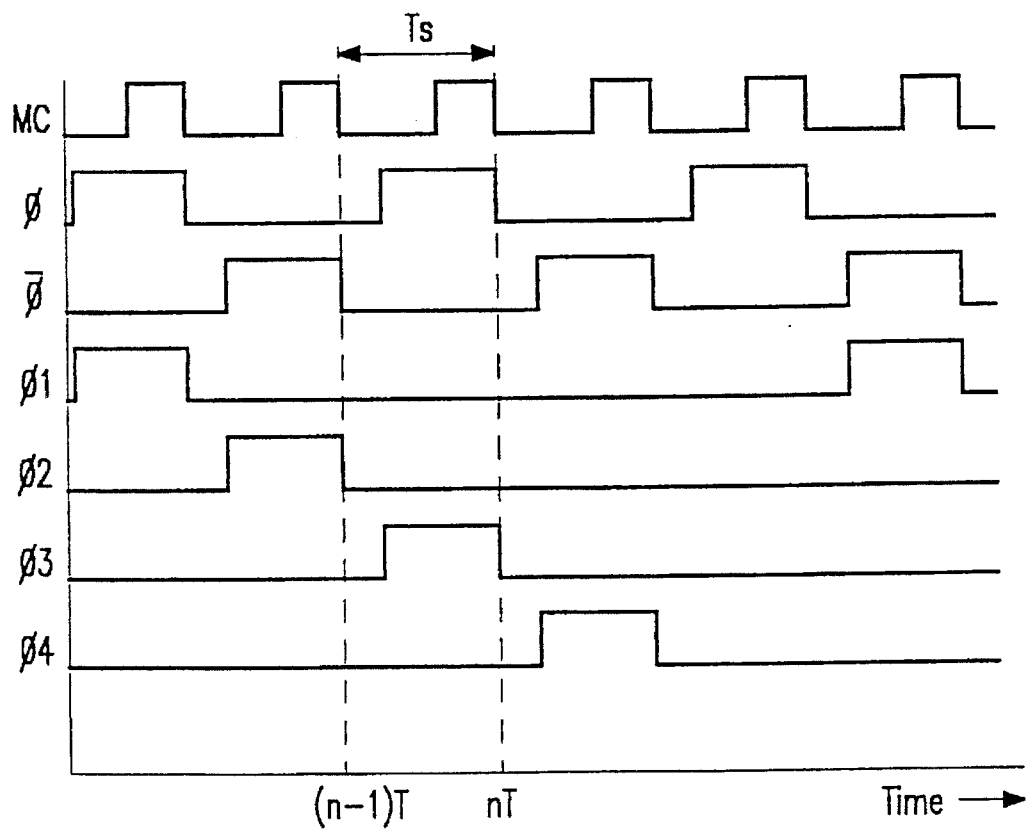
FIG. 9B shows clock phase signals for controlling the switches in the circuit of FIG. 9C.
Figure 9C:
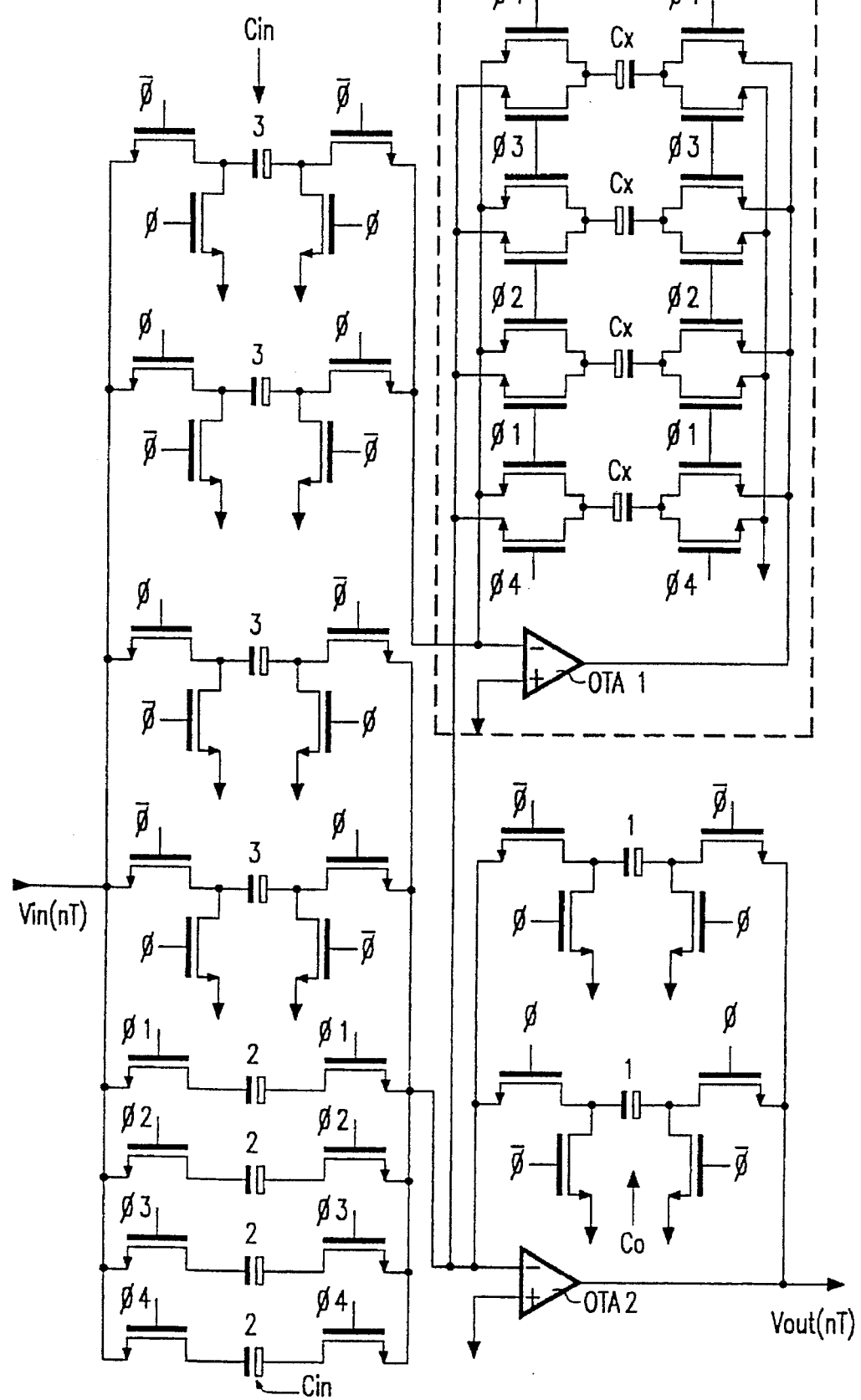

FIG. 9C shows a realization of a comb video bandpass filter using the inverting delay circuit in accordance with the present invention. The algorithm is illustrated in FIG. 9A. Only two amplifiers OTA1 and OTA2, four clock signals $\phi1$, $\phi2$, $\phi3$ and $\phi4$ (shown in FIG. 9B), and 14 capacitors are required for the construction of this bandpass filter which is based on a double sampling N-path embodiment. The relative magnitudes of the input capacitors Cin and the output capacitors Co are indicated in the figure.

As shown in FIG. 9C, the circuit input, which receives the input video signal Vin(nT), is connected to the inverting input of the amplifier OTA 1 through two branches having input capacitors Cin of relative magnitude 3. Controlled by the clock phases $\phi$ and $\bar{\phi}$, alternatingly one of these input capacitors is connected between the circuit input and the inverting input of the amplifier OTA1, while the other input capacitor is discharged.

The circuit input is connected to the inverting input of the amplifier OTA2 through two branches having input capacitors Cin of relative magnitude 3, and through four branches having input capacitors Cin of relative magnitude 2. Controlled by the clock phases $\phi$ and $\bar{\phi}$, alternatingly one of these two input capacitors Cin of relative magnitude 3 is charged, while the charge of the input capacitors Cin of relative magnitude 3 is transferred to the amplifier OTA2. Controlled by the clock phases $\phi1$, $\phi2$, $\phi3$ and $\phi4$, each time one of the four input capacitors Cin of relative magnitude 2 is connected between the circuit input and the inverting input of the amplifier OTA2.

The first amplifier OTA 1 has four switched capacitor feedback branches, each containing a feedback capacitor Cx. The switches are controlled by the clock phases $\phi1$, $\phi2$, $\phi3$ and $\phi4$ such that each feedback capacitor Cx is connected between the inverting input and the output of the amplifier OTA1 during one of these four clock phases, while three clock phases later, its charge is transferred to the output capacitors Co across second amplifier OTA2.

The second amplifier OTA2 has two parallel switched capacitor output branches, the switches around the output capacitors Co of which being controlled by the clock phase signals $\phi$ and $\bar{\phi}$ such that the output capacitors Co are in turn and alternatingly connected between the inverting input and the output of the second amplifier OTA2, and discharged. The output capacitors Co are of relative magnitude 1. The output of the second amplifier OTA2 supplies the comb filtered output signal Vout(nT).

The following advantages of the inverting delay circuit according to the invention can be noted. The invention makes possible the realization of an inverting delay circuit using switched capacitor techniques in CMOS which is insensitive to bottom-plate parasitic capacitors. This is done using one or more intermediate capacitors Cx which play no part whatsoever in the ultimate transfer function of the circuit. Exact matching is made possible between positive and negative coefficients, such as required for making FIR and IIR filters and multipliers. The invention makes it possible to realize a complicated FIR or IIR filter or multiplier using only a single operational transconductance amplifier OTA, based on an N-path structure (with N positive coefficients and matching N negative coefficients). The invention may also be used with double-sampling techniques, but a second differential amplifier OTA2 is then necessary.

It should be noted that the above-mentioned embodiments illustrate rather than limit the invention, and that those skilled in the art will be able to design many alternative embodiments without departing from the scope of the appended claims.

I claim:

1. An inverting delay circuit comprising:

differential amplifying means (OTA) having non-inverting input means (+) coupled to ground, inverting input means (−) and output means;

input capacitor means (Cin) which are coupled between an input of said inverting delay circuit and said inverting input means (−) during a first switching phase (φ, 1), said input capacitor means (Cin) being discharged during another switching phase ($\bar{\phi}$, 4);

feedback capacitor means (Cx) which are coupled between said output means and said inverting input means (−) during said first switching phase (φ, 1), said feedback capacitor means (Cx) being coupled between said inverting input means (−) and ground during a second switching phase ($\bar{\phi}$, 2), wherein said feedback capacitor means does not affect a transfer function of said inverting delay circuit; and output capacitor means (Co) which are coupled between said output means and said inverting input means (−) during said second switching phase ($\bar{\phi}$, 2), said output capacitor means (Co) being discharged during said first switching phase (φ, 1), a charge on said feedback capacitor means (Cx) being transferred to said output capacitor means (Co) during said second switching phase ($\bar{\phi}$, 2).

2. An inverting delay circuit as claimed in claim 1, wherein said differential amplifying means (OTA) comprises a first differential amplifier (OTA1) and a second differential amplifier (OTA2), said inverting input means comprising inverting inputs of said first (OTA1) and second (OTA2) amplifiers, and said output means comprising outputs of said first (OTA1) and second (OTA2) amplifiers;

said feedback capacitor means (Cx) being coupled between said output and said inverting input of said first differential amplifier (OTA1) during said first switching phase (φ), said feedback capacitor means (Cx) being coupled between said inverting input of said second differential amplifier (OTA2) and ground during said second switching phase ($\bar{\phi}$); and said output capacitor means (Co) being coupled between said output and said inverting input of said second differential amplifier (OTA2) during said second switching phase ($\bar{\phi}$).

3. An inverting delay circuit as claimed in claim 1, wherein said feedback capacitor means (Cx) include a plurality of switched feedback capacitors (Cx) which are coupled between said output means and said inverting input means (−) during respective first derived switching phases (1, 3, n−1), said feedback capacitors (Cx) being coupled between said inverting input means (−) and ground during respective second switching phases (2, n−2, n).

4. An inverting delay circuit as claimed in claim 1, wherein said feedback capacitor means (Cx) includes first and second feedback capacitors (Cx), said first feedback capacitor(s) being coupled between said output means and said inverting input means (−) during said first switching phase (φ), said first feedback capacitor(s) (Cx) being coupled between said inverting input means (−) and ground during said second switching phase ($\bar{\phi}$), said second feedback capacitor(s) being coupled between said output means and said inverting input means (−) during said second switching phase ($\bar{\phi}$), said second feedback capacitor(s) (Cx) being coupled between said inverting input means (−) and ground during said first switching phase (φ);

said output capacitor means (Co) includes first and second output capacitors (Co), said first output capacitor (Co) being coupled between said output means and said inverting input means (−) during said second switching phase ($\bar{\phi}$), said first output capacitor (Co) being discharged during said first switching phase (φ), a charge on said first feedback capacitor(s) (Cx) being transferred to said first output capacitor (Co) during said second switching phase ($\bar{\phi}$), said second output capacitor (Co) being coupled between said output means and said inverting input means (−) during during said first switching phase (φ), said second output capacitor (Co) being discharged said second switching phase ($\bar{\phi}$), a charge on said second feedback capacitor(s) (Cx) being transferred to said second output capacitor (Co) during said first switching phase (φ).

5. An inverting delay circuit comprising:

differential amplifying means having non-inverting input means coupled to ground, inverting input means and output means;

input capacitor means having a first terminal means and a second terminal means;

first switching means for coupling the first terminal means of said input capacitor means to an input of said inverting delay circuit, and the second terminal means of said input capacitor means to said inverting input means during a first switching phase;

second switching means coupled to the first and second terminal means of said input capacitor means for discharging said input capacitor means during another switching phase;

feedback capacitor means having first terminal means and second terminal means;

third switching means for coupling the first terminal means of said feedback capacitor means to the output means of said differential amplifying means during said first switching phase;

fourth switching means for coupling the first terminal means of said feedback capacitor means to ground during a second switching phase;

means for coupling the second terminal means of said feedback capacitor means to the inverting input means of said differential amplifying means during said first and second switching phases;

output capacitor means having first terminal means and second terminal means;

fifth switching means coupled to the first and second terminal means of said output capacitor means for discharging said output capacitor means during said first switching phase; and sixth switching means for coupling the first terminal means of said output capacitor means to said inverting input means and the second terminal means of said output capacitor means to said output means of said differential amplifying means during said second switching means;

whereby said input capacitor means is discharged during said second switching phase, said output capacitor means is discharged during said first switching phase, and said feedback capacitor means does not affect a transfer function of the inverting delay circuit.

6. An inverting delay circuit as claimed in claim 5, wherein said differential amplifying means comprises a first differential amplifier and a second differential amplifier, said inverting input means comprising inverting inputs of said first and second amplifiers, and said output means comprising outputs of said first and second amplifiers; said third switching means coupling the first terminal means of said feedback capacitor means to the output of said first differential amplifier during said first switching phase, said fourth switching means coupling the first terminal means of said feedback capacitor means to ground during said second switching phase, and said coupling means coupling the second terminal means of said feedback capacitor means to the inverting input of said first differential amplifier during said first switching phase and to the inverting input of said second differential amplifier during said second switching phase; and said sixth switching means coupling the first terminal means of said output capacitor means to the inverting input of said second differential amplifier and the second terminal means of said output capacitor means to the output of said second differential amplifier during said second switching phase.

7. An inverting delay circuit as claimed in claim 5, wherein said feedback capacitor means includes a plurality of feedback capacitors each having first and second terminals, said third switching means comprises a plurality of third switches for coupling the first terminals, respectively, of said feedback capacitors to the output means during respective first derived switching phases, and said fourth switching means comprises a plurality of fourth switches for coupling the first terminals, respectively, of said feedback capacitors to ground during respective second switching phases.

8. An inverting delay circuit as claimed in claim 5, wherein said feedback capacitor means comprises first and second feedback capacitors each having first and second terminals, said third switching means comprises third switches for coupling the first terminal of said first feedback capacitor to said output means, and the first terminal of said second feedback capacitor to ground during said first switching phase, and said fourth switching means comprises fourth switches for coupling the first terminal of said first feedback capacitor to ground and the first terminal of said second feedback capacitor to said output means during said second switching phase; and said output capacitor means comprises first and second output capacitors each having first and second terminals, said fifth switching means comprises fifth switches coupling the first and second terminals of said first output capacitor to ground during said first switching phase, and coupling the first and second terminals of said second output capacitor to ground during said second switching phase, and said sixth switching means comprises sixth switches for coupling the first terminal of said first output capacitor to the inverting input means and the second terminal of the first output capacitor to said output means during said second switching phase, and the first terminal of said second output capacitor to the inverting input means and the second terminal of said second output capacitor to the output means during said first switching phase, whereby said first output capacitor is discharged during said first switching phase and said second output capacitor is discharged during said second switching phase, and a charge on said first feedback capacitor is transferred to said first output capacitor during said second switching phase and a charge on said second feedback capacitor is transferred to said second output capacitor during said first switching phase.

* * * * *